(12) United States Patent
Hattori

(10) Patent No.: US 9,838,032 B2
(45) Date of Patent: Dec. 5, 2017

(54) DATA COMPRESSION DEVICE, DATA COMPRESSION METHOD, AND COMPUTER PROGRAM PRODUCT

(71) Applicants:KABUSHIKI KAISHA TOSHIBA, Minato-ku, Tokyo (JP); TOSHIBA SOLUTIONS CORPORATION, Kawasaki-shi, Kanagawa (JP)

(72) Inventor: Masakazu Hattori, Inagi (JP)

(73) Assignees: Kabushiki Kaisha Toshiba, Tokyo (JP); Toshiba Solutions Corporation, Kawasaki-shi, Kanagawa (JP)

( * ) Notice: Subject to any disclaimer, the term of this patent is extended or adjusted under 35 U.S.C. 154(b) by 938 days.

(21) Appl. No.: 14/208,061

(22) Filed: Mar. 13, 2014

(65) Prior Publication Data

US 2014/0214781 A1  Jul. 31, 2014

Related U.S. Application Data

(63) Continuation of application No. PCT/JP2013/052245, filed on Jan. 31, 2013.

(51) Int. Cl.
*G06F 7/00* (2006.01)
*H03M 7/30* (2006.01)

(52) U.S. Cl.
CPC ................ *H03M 7/3059* (2013.01)

(58) Field of Classification Search
CPC .................................................. H03M 7/3059
(Continued)

(56) References Cited

U.S. PATENT DOCUMENTS 4,669,097 A    5/1987  Bristol
5,228,100 A *  7/1993  Takeda ................ G06F 17/243
                                              382/175
(Continued)

FOREIGN PATENT DOCUMENTS

JP    2003-15734    1/2003
JP    4719667       4/2011
(Continued)

OTHER PUBLICATIONS

Exteneded European Search Report issued by the European Patent Office in counterpart European Application No. 13 83 6184, dated Jul. 28, 2016 (11 pages).

(Continued)

*Primary Examiner* — Tan V. Mai
(74) *Attorney, Agent, or Firm* — Finnegan, Henderson, Farabow, Garrett & Dunner, L.L.P.

(57) ABSTRACT

According to an embodiment, a data compression device includes a receiving unit, generating unit, a selecting unit, and a compressing unit. The receiving receives input data pieces. The generating unit generates starting point candidates representing the data having an error within a threshold value with respect to starting point data input at a first timing. The selecting unit refers to the starting point candidates, end point data input at a second timing, and intermediate data input at a timing in between the first timing and the second timing; and selects the starting point candidate which, as compared to the other candidates, has a greater number of pieces of the intermediate data approximated using the starting point candidate and using the end point data in such a way that the error is within the threshold value. The compressing unit outputs the selected starting point candidate and the end point data.

10 Claims, 13 Drawing Sheets

(58) Field of Classification Search
USPC .......................................................... 708/203
See application file for complete search history.

(56) References Cited

U.S. PATENT DOCUMENTS

| | | |
|---|---|---|
| 7,076,402 B2 | 7/2006 | Williams |
| 2005/0143981 A1 | 6/2005 | Koyanagi |
| 2011/0242552 A1* | 10/2011 | Aoki ..................... G06T 11/203 358/1.3 |
| 2012/0046804 A1 | 2/2012 | Bordeleau et al. |

FOREIGN PATENT DOCUMENTS

| | | |
|---|---|---|
| JP | 4808721 | 8/2011 |
| WO | WO 01/95496 | 12/2001 |
| WO | WO 2012-10319 | 1/2012 |

OTHER PUBLICATIONS

Lu, B., et al., "An Improved Data Compression Algorithm Based on Real Time Database", Computer Applications and Software, vol. 26, No. 11, 4 pages (Nov. 2009).

Zhang, J., et al., "An New Data Compression based on ISDT Algorithm and its Performance Analysis", Fire Control and Command Control, Vo. 32, No. 2, 4 pages (Feb. 2007).

Notification of the First Office Action issued by the State Intellectual Property Office (SIPO) of the People's Republic of China in counterpart Chinese Application No. 201380003042.4, dated Aug. 3, 2016 (8 pages).

International Search Report issued by the Japanese Patent Office dated Mar. 26, 2013, for International Patent Application No. PCT/JP2013/052245.

Watson, M. J. et al., "A Practical Assessment of Process Data Compression Techniques," Ind. Eng. Chem. Res., vol. 37, No. 1, pp. 267-274, (1998).

Bristol, E. H., "Swinging Door Trending: Adaptive Trend Recording," ISA National Conf. Proc., pp. 749-756, (1990).

James, P. A., "Data Compression for Process Historians," http://www.castdiv.org/archive/data_compression.pdf, (1995).

Xiaodong, F. et al., "An Improved Process Data Compression Algorithm," Proceedings of the $4^{th}$ World Congress on Intelligent Control and Automation, vol. 3, pp. 2190-2193, (2002).

Chen, G. et al., "An Optimized Algorithm for Lossy Compression of Real-Time Data," Intelligent Computing and Intelligent Systems (ICIS), 2010 IEEE International Conference, vol. 2, pp. 187-191, (2010).

Patent Examination Report No. 1 issued by the Australian Patent Office dated Jun. 23, 2015, for Australian Patent Application No. 2013376200.

* cited by examiner

DATA COMPRESSION DEVICE, DATA COMPRESSION METHOD, AND COMPUTER PROGRAM PRODUCT

CROSS-REFERENCE TO RELATED APPLICATIONS

This application is a continuation of PCT international application Ser. No. PCT/JP2013/052245 filed on Jan. 31, 2013 which designates the United States, the entire contents of which are incorporated herein by reference.

FIELD

Embodiments described herein relate generally to a data compression device, a data compression method, and a computer program product.

BACKGROUND

A method of data compression is known in which, from time-series data that is input, point data constituting the time-series data is subjected to thinning. In regard to such a method of data compression; the Box Car algorithm, the Backward Slope algorithm, and the Swinging Door algorithm are available.

The Swinging Door algorithm is a representative example of the algorithms in which data thinning is achieved by performing linear approximation in such a way that the error is equal to or smaller than a predetermined threshold value. In the Swinging Door algorithm, a single point is fixed as the starting point, and linear approximation is performed in such a way that the error is equal to or smaller than a predetermined threshold value.

There is a trend of an increase in the types and the size of time-series data stored in time-series databases. In that regard, there has been a demand for a method which would enable achieving compression of time-series data in a more efficient manner.

DETAILED DESCRIPTION

Figure 1:
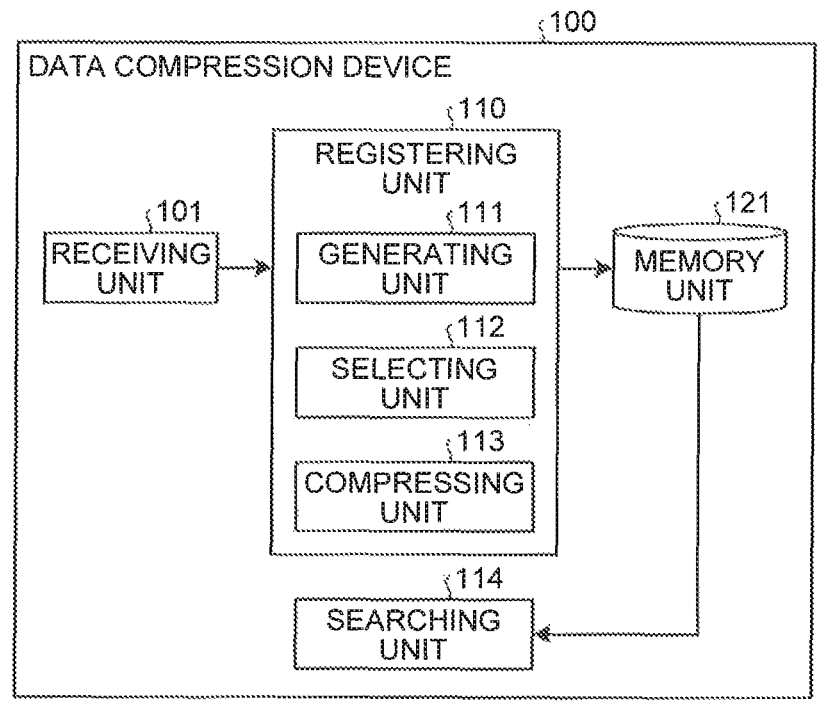
FIG. 1 is a block diagram illustrating an exemplary configuration of a data compression device according to a first embodiment.

According to an embodiment, a data compression device includes a receiving unit, a generating unit, a selecting unit, and a compressing unit. The receiving receives a plurality of pieces of input data which is input in chronological order. The generating unit generates a plurality of starting point candidates which represents the data having an error within a threshold value with respect to starting point data. The starting point data is the input data input at a first timing. The selecting unit refers to the starting point candidates, end point data which is the input data input at a second timing, and intermediate data which is the input data input at a timing in between the first timing and the second timing; and selects, from among the starting point candidates, the starting point candidate which, as compared to the other starting point candidates, has a greater number of pieces of the intermediate data approximated using the starting point candidate and using the end point data in such a way that the error is within the threshold value. The compressing unit outputs the selected starting point candidate and the end point data as output data obtained by compressing the starting point data, the intermediate data, and the end point data.

Various embodiments are described below in detail with reference to the accompanying drawings.

First Embodiment

As described above, according to the Swinging Door algorithm or the like, a single starting point is set and linear approximation is performed in order to compress time-series data. In a data compression device according to a first embodiment, a plurality of starting points (starting point candidates) is set, and time-series data is compressed using such a starting point candidate which enables achieving compression in a more efficient manner.

Herein, the explanation is given about the terms used in the embodiments.

Time-series data points to a series of values (a point data string) obtained by observing or measuring temporal changes of a particular phenomenon. Usually, time-series data is measured at predetermined time intervals. Examples of time-series data include share prices and sensor values of an in-plant installation. For example, regarding a number of devices constituting an in-plant installation; a series of values of humidity, a series of values of vibrations, or a series of values of control setting can be said to form a single piece of time-series data.

A time-series database is created by compiling time-series data. As a time-series database, a large volume of time-series data is stored in chronological order in a memory of a computer or in an external memory device (a hard disk).

A data item which is the smallest unit of data storage is called a tag. A tag is made of a data value, a time stamp, a data status, and the like. The data that is to be collected has types such as operating data which is input from a control system, computational data which is obtained by implementing an online computation function, data which is manually input by an operator, and interface data which is input from other systems.

In a time-series database, generally, there are several thousands to several tens of thousands of tags. The data storage period for each tag ranges from one year to several years. As far as the data collection cycle is concerned, although it is dependent on the real-time property of the concerned system (such as an in-plant installation); it ranges from a few seconds to one minute as a rough indication.

If it is assumed that the collected data is stored without any modification, then a time-series database needs to have the database capacity of about 10 GB (gigabytes) to 10 TB (terabytes). If the database capacity is increased to that extent, then it is bound to cause deterioration in the retrieval performance.

In that regard, for example, in an in-plant installation, a technology of data compression is implemented by making use of the property that, during stable operations, the operating data undergoes only a small change. In an in-plant installation, it is estimated that the behavior of the original data can be understood by referring to compressed data having the compression ratio of 1:20.

In this way, since a time-series database needs a large-capacity memory area; there has been a demand for a method which would enable achieving compression of time-series data in a more efficient manner.

Given below is the explanation of a data compression device according to a first embodiment. FIG. 1 is a block diagram illustrating an exemplary configuration of a data compression device 100 according to the first embodiment. As illustrated in FIG. 1, the data compression device 100 includes a receiving unit 101, a registering unit 110, a searching unit 114, and a memory unit 121.

The receiving unit 101, the registering unit 110, and the searching unit 114 can be implemented, for example, by executing a program in a processor such as a CPU (Central Processing Unit), that is, can be implemented using software; or can be implemented using hardware such as an IC (Integrated Circuit); or can be implemented using a combination of software and hardware.

The memory unit 121 is used to store a variety of data. For example, the memory unit 121 is used to store time-series data that has been compressed by a compressing unit 113. The memory unit 121 can be configured with any commonly-used memory medium such as an HDD (Hard Disk Drive), an optical disk, a memory card, and a RAM (Random Access Memory).

The receiving unit 101 receives processing requests and data that are input from external devices such as client devices. A processing request points to, for example, a time-series data registration request or a time-series data search request. In the case of a registration request, the receiving unit 101 receives a plurality of pieces of input data (point data of time-series data) that is input in chronological order. Alternatively, the receiving unit 101 can also receive pieces of point data that are input in real time. For example, the receiving unit 101 stores the pieces of point data, which are input in real time in the memory unit 121. Still alternatively, the receiving unit 101 can receive pieces of point data in chronological order from the time-series data stored in the memory unit 121. In the case of receiving input of the time-series data from the memory unit 121, the configuration can be such that the receiving unit 101 goes back in time to a particular timing serving as the starting point, that is, receives the pieces of point data in a sequential manner starting from an earlier timing.

The registering unit 110 performs, based on an allowable error, an operation (a compression operation) of thinning a piece of point data from a series of point data that is input; and registers the post-thinning point data as time-series data in the memory unit 121. Regarding an algorithm for thinning a piece of point data using starting point candidates and using other pieces of point data; it is possible to use any one of the conventional algorithms such as the Swinging Door algorithm. Meanwhile, the registering unit 110 includes a generating unit 111, a selecting unit 112, and the compressing unit 113.

The generating unit 111 generates a plurality of starting point candidates that represents data having an error within a predetermined threshold value with respect to starting point data, which is the point data at a particular timing (a first timing).

The selecting unit 112 selects, from among the starting point candidates, such a starting point candidate which enables achieving compression, of the time-series data in a more efficient manner. For example, the selecting unit 112 selects, from among the starting point candidates, such a starting point candidate which has a greater number of pieces of point data (intermediate data) that is approximated using the concerned starting point candidate and using end point data, which is input at a different timing (a second timing) than the timing of the starting point, data, in such a way that the error is within a predetermined threshold value.

Then, the compressing unit 113 outputs the selected starting point candidate and the end point data as a piece of post-compression time-series data (output data). The compressing unit 113 stores, for example, the post-compression time-series data in the memory unit 121 in a sequential manner. Alternatively, the compressing unit 113 can also store at once a plurality of pieces of post-compression time-series in the memory unit 121.

The searching unit 114 searches for the time-series data that is stored in the memory unit 121. For example, when a start timing, an end timing, and a sampling interval are specified; the searching unit 114 searches, at the specified sampling interval, the time-series database for a point data series in a section from the start timing to the end timing. Since there are times when the registering unit 110 performs point data thinning, sometimes point data may not be retrieved at the specified sampling interval. In such a case, the searching unit 114 interpolates the point data using, for example, the linear interpolation method that is an example of the methods to perform interpolation between two points, if (xs, ys) represents the start point and if (xe, ye) represents the end point; then, with respect to an arbitrary x present on the straight line joining the start point and the end point, the value of y can be obtained using Equation (1). Meanwhile, xe≠xs is satisfied.

$$y=ys+(x-xs)(ye-ys)/(xe-xs) \qquad (1)$$

Figure 2:
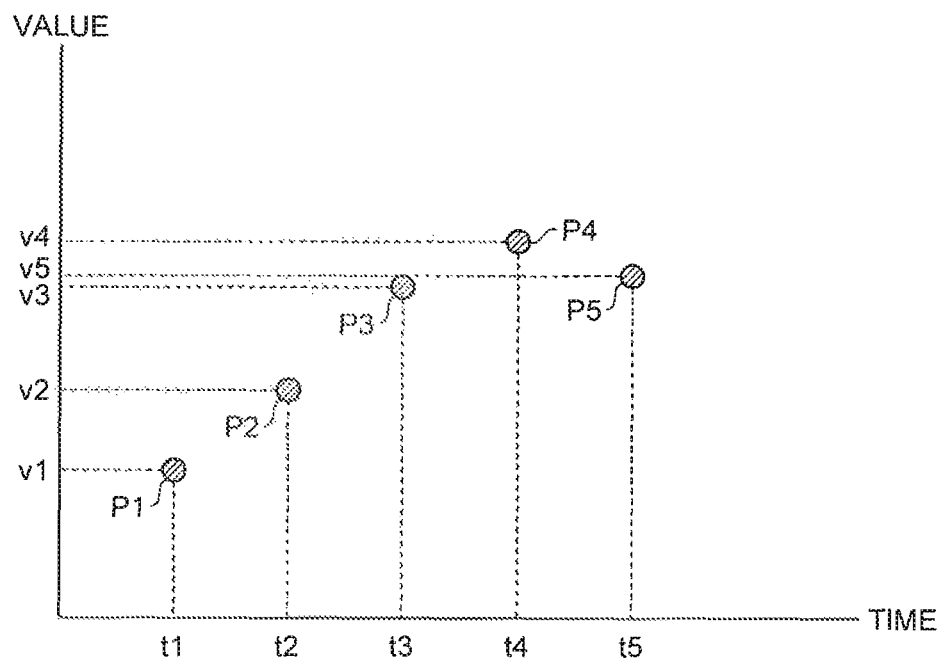
FIG. 2 is a diagram illustrating an example of time-series data.

Given below is the explanation of a specific example of a data compression operation performed according to the first embodiment. FIG. 2 is a diagram illustrating an example of time-series data. In FIG. 2 is illustrated time-series data that contains five pieces of point data, namely, P1, P2, P3, P4, and P5. As described below, point data represents, for example, a combination of a timing (Time) and a value (Value). Herein, it is not always necessary to have a constant time interval.

P1<t1, v1>, P2<t2, v2>, P3<t3, v3>, P4<t4, v4>, and P5<t5, v5> are present. Moreover, t1<t2<t3<t4<t5 is satisfied.

Figure 3:
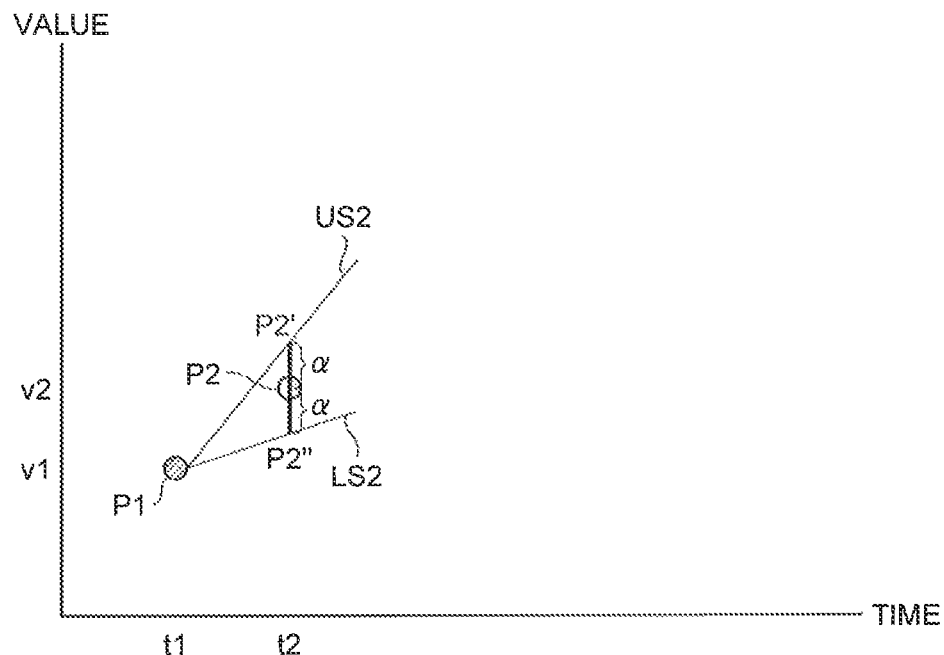
FIG. 3 is a diagram for explaining a first method for compression of time-series data.
Figure 4:
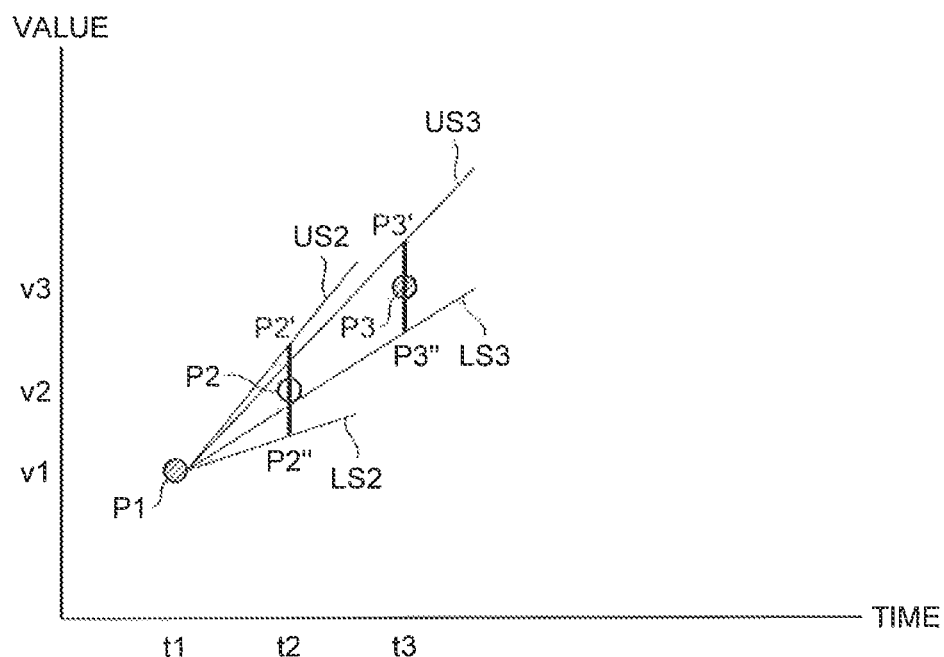
FIG. 4 is a diagram for explaining the first method for compression of time-series data.
Figure 5:
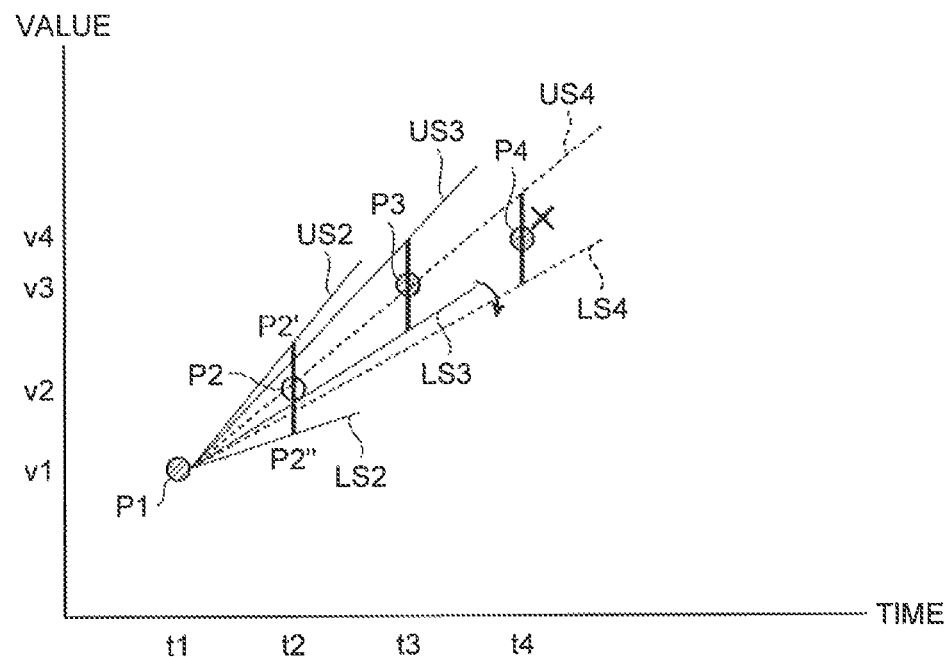
FIG. 5 is a diagram for explaining the first method for compression of time-series data.

FIG. 3 to FIG. 5 are diagrams for explaining a first method for compression of time-series data. As illustrated in FIG. 3, α represents the allowable error specified in advance. Moreover, P1 is set as the starting point data. When P2 is input as a new piece of point data, the registering unit 110 obtains an upper limit slope US2 and a lower limit slope LS2 with respect to P2.

Firstly, with respect to the value <t2, v2> of P2, the registering unit 110 obtains two piece of point data P2'<t2, v2+α> and P2"<t2, v2−α> that have the largest allowable error at the timing t2. The upper limit slope US2 represents the tilt or the line segment from P1 to P2', and can be obtained as US2=(v2+α−V1)/(t2−t1). The lower limit slope LS2 represents the tilt of the line segment from P1 to P2", and can be obtained as LS2=(v2−α−v1)/(t2−t1).

As illustrated in FIG. 4, when P3 is input as a new piece of point data, the registering unit 110 obtains an upper limit slope US3 and a lower limit slope LS3 with respect to P3. The upper limit slope US3 represents the tilt of the line segment from P1 to P3', and can be obtained as US3=(v3+α−V1)/(t3−t1). The lower limit slope LS3 represents the tilt of the line segment from P1 to P3", and can be obtained as LS3=(v3−α−v1)/(t3−t1).

If the upper limit slope US3 up to P3 is smaller than the upper limit slope US2 up to P2 and if the lower limit slope LS3 up to P3 is greater than the lower limit slope LS2 up to P2, then the older piece of point data P2 is subjected to thinning.

As illustrated in FIG. 5, when P4 is input as a new piece of point data, the registering unit 110 obtains an upper limit slope US4 and a lower limit slope LS4 with respect to P4. If the upper limit slope US4 up to P4 is smaller than the upper limit slope US3 up to P3 and if the lower limit slope LS4 up to P4 is greater than the lower limit slope LS3 up to P3, then the older piece of point data P3 is subjected to thinning.

However, in the example illustrated in FIG. 5, the lower limit slope LS4 up to P4 is smaller than the lower limit slope LS3 an to P3. As a result, P4 cannot be subjected to thinning, and P3 remains as the end point data. Thus, in the time-series database (in the memory unit 121), two pieces of point data P1 and P3 get archived.

Figure 6:
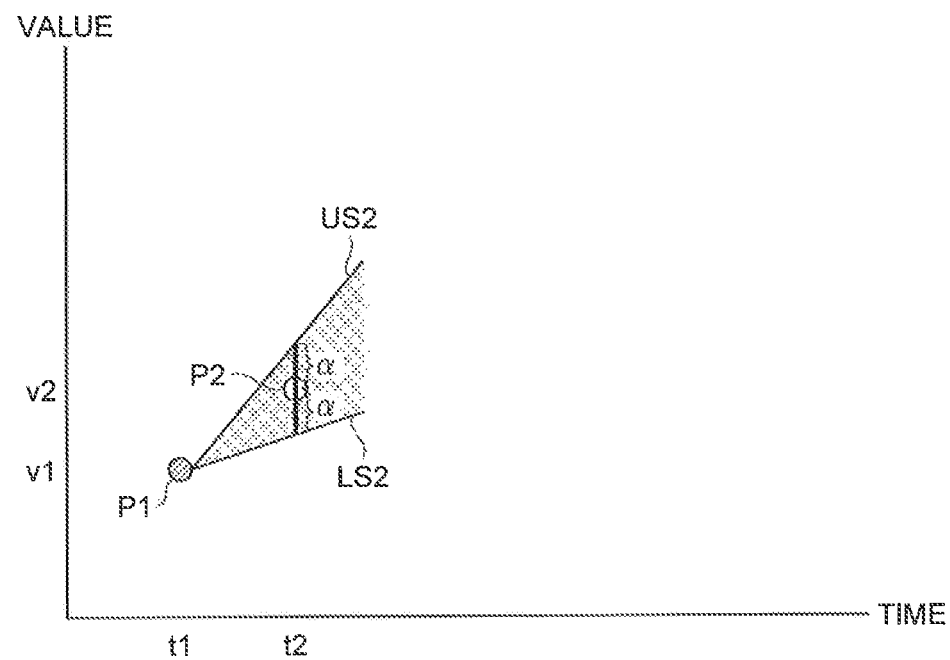
FIG. 6 is a diagram for explaining a second method for compression of time-series data.

FIG. 6 to FIG. 9 are diagrams for explaining a second method for compression of time-series data. As illustrated in FIG. 6, α represents the allowable error specified in advance. Moreover, P1 is set as the starting point data. When P2 is input as a new piece of point data, the registering unit 110 obtains the upper limit slope US2 and the lower limit slope LS2 with respect to P2. Herein, the registering unit 110 can obtain the upper limit slope US2 and the lower limit slope LS2 by implementing a method identical to the method explained with reference to FIG. 3. However, from the first method explained with reference to FIG. 3, the second method differs in the way that an allowable error range can be obtained. In FIG. 6, a portion between oblique lines represents the allowable error range with respect to P2. Herein, the allowable error range with respect to P2 is identified by two parameters, namely, the upper limit slope US2 and the lower limit slope LS2.

Figure 7:
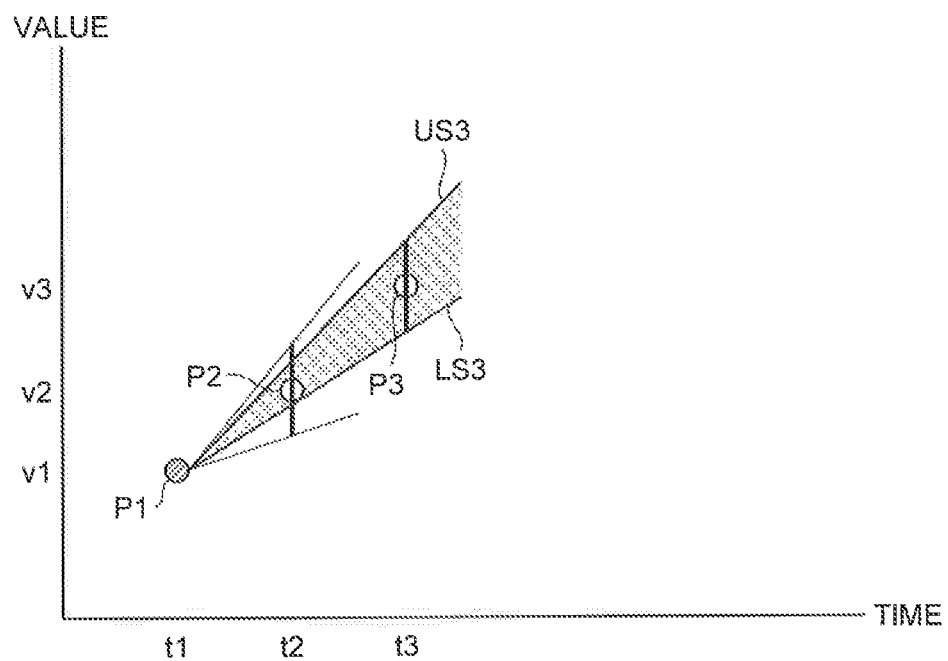
FIG. 7 is a diagram for explaining the second method for compression of time-series data.
Figure 8:
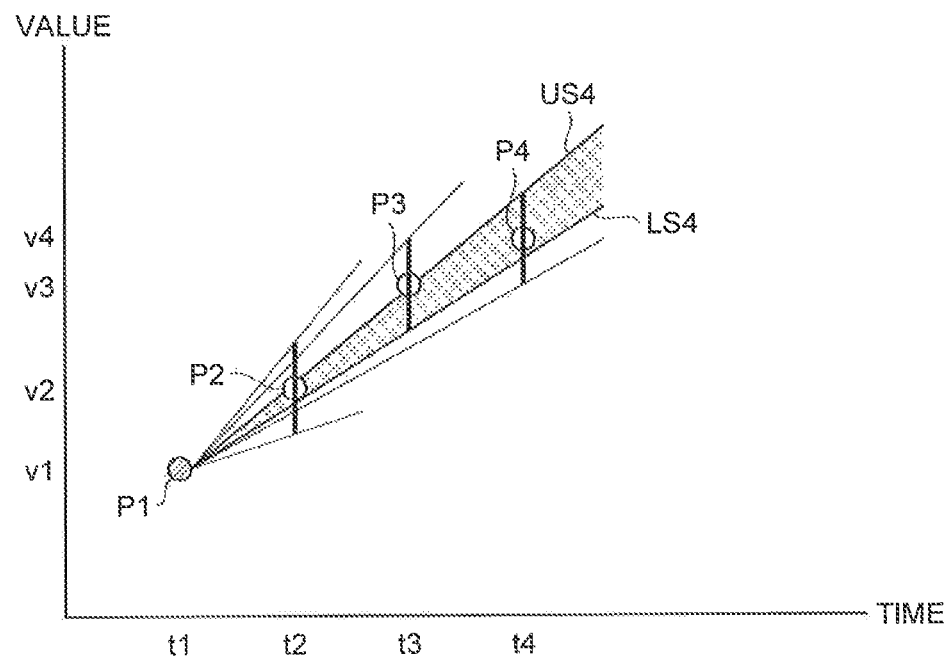
FIG. 8 is a diagram for explaining the second method for compression of time-series data.

As illustrated in FIG. 7, when P3 is input as a new piece of point data, the registering unit 110 obtains a provisional upper limit slope US3 and a provisional lower limit slope LS3 with respect to P3. The allowable error range with respect to P3 is identified by two parameters, namely, the upper limit slope US3 and the lower limit slope LS3. The registering unit 110 sets, as the allowable error range with respect to P3, the overlapping portion between the allowable error range with respect to P2 and a provisional allowable error range with respect to P3.

The registering unit 110 calculates, for example, "LS2>US3∨LS3>US2". If that value is true, then the registering unit 110 determines that the allowable error range with respect to P2 does not overlap with the provisional allowable error range with respect to P3. However, if that value is false, then the registering unit 110 determines that the allowable error range with respect to P2 overlaps with the provisional allowable error range with respect to P3.

In the example illustrated in FIG. 7, since there is overlapping of the two allowable error ranges, the registering unit 110 obtains the allowable error range with respect to P3 in the following manner. Min(A, B) is a function that returns the smaller value from among A and B. Max(A, B) is a function that returns the greater value from among A and B. Herein, P2 is subjected to thinning.

US3'=Min(US3,US2)

LS3'=Max(LS3,LS2)

As illustrated in FIG. 3, when P4 is input as a new piece of point data, the registering unit 110 obtains a provisional upper limit slope US4 and a provisional lower limit slope LS4 with respect to P4. Then, in an identical manner to the explanation with reference to FIG. 7, the registering unit 110 determines whether or not the allowable error range with respect to P3 overlaps with the provisional allowable error range with respect to P4. In the example illustrated in FIG. 8, since there is overlapping of the two allowable error ranges, the registering unit 110 obtains the allowable error range with respect to P4 in the following manner. Herein, P3 is subjected to thinning.

US4'=Min(US4,US3)

LS4'=Max(LS4,LS3)

US4=US4'

LS4=LS4'

Figure 9:
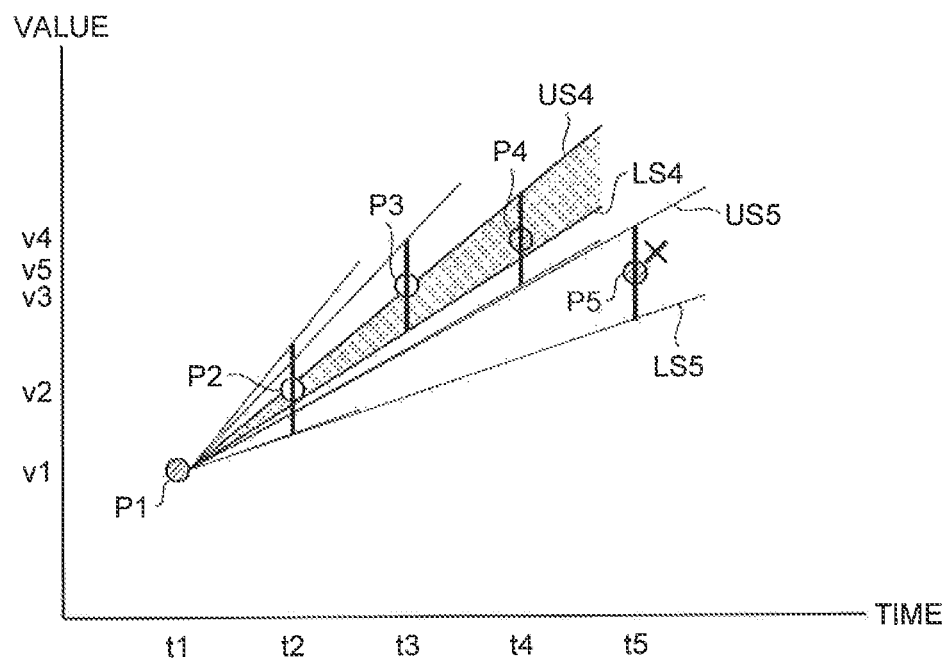
FIG. 9 is a diagram for explaining the second method for compression of time-series data.
Figure 10:
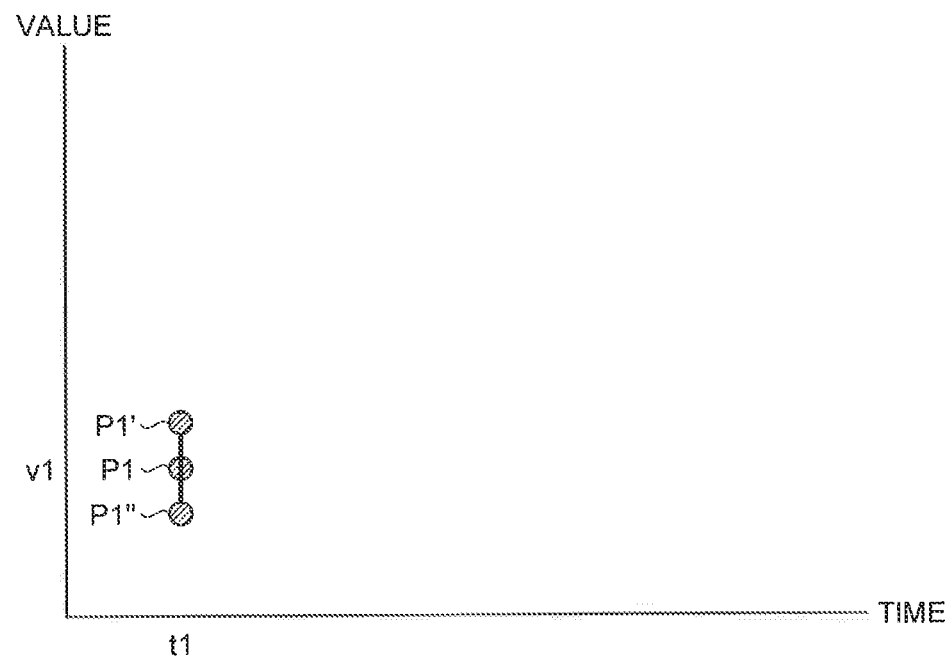
FIG. 10 is a diagram for explaining an example of a method for compression of time-series data according to the first embodiment.

As illustrated in FIG. 9, when P5 is input as a new piece of point data, the registering unit 110 obtains a provisional upper limit slope US5 and a provisional lower limit slope LS5 with respect to P5. Then, the registering unit 110 calculates "LS4>US5∨LS5>US4". In the example illustrated in FIG. 9, since that value is true, the registering unit 110 determines that the allowable error range with respect to P4 does not overlap with the allowable error range with respect to P5. As a result, P5 cannot be subjected to thinning, and P4 remains as the end point data. Thus, in the time-series database (in the memory unit 121), two pieces of point, data P1 and P4 get archived.

As far as the algorithm in the method for compression is concerned, the registering unit 110 can implement any one of the first method and the second method. Alternatively, the registering unit 110 can implement any other algorithm too. Conventionally, any such algorithm is implemented by setting a single starting point. However, in contrast, the registering unit 110 sets a plurality of starting points (starting point candidates) and implements an abovementioned algorithm with respect to a plurality of starting point candidates.

FIG. 10 to FIG. 13 are diagrams for explaining an example of a method for compression of time-series data according to the first embodiment. In the first and second methods for compression, only a single point serves as the starting point at t1. In contrast, in the first embodiment, a plurality of starting point candidates is set, and thinning calculation is performed in parallel while treating each starting point candidate as the starting point.

If the number of starting points to be generated is set to three; then the generating unit 111 generates, for example, P1<t1, v1>, P1'<t1, v1+α>, and P1"<t1, v1−α> as the starting point candidates. If the number of starting points to be generated is set to N; then the generating unit 111 generates, for example, <t1, v1+α>, <t1, v1+α×(1−2/(N−1))×1>, <t1, v1+α×(1−2/(N−1))×2>, <t1, v1>, . . . , and <t1, v1−α> as the starting point candidates. However, the method of generating the starting point candidates is not limited to this method. That is as long as a value is within the range of the allowable error a centered on the starting point data, any piece of point data can be treated as a starting point candidate.

Figure 11:
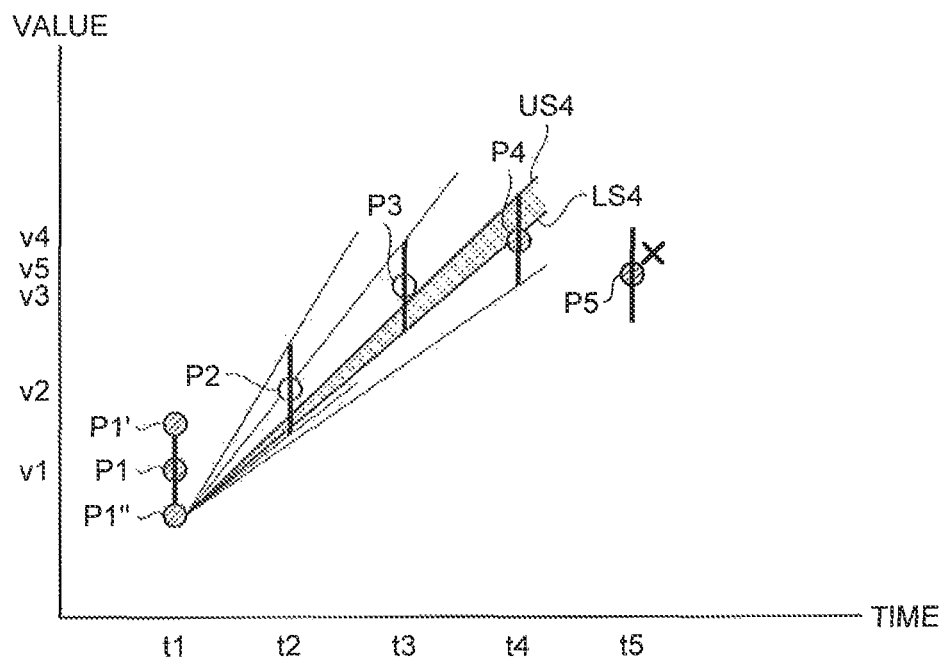
FIG. 11 is a diagram for explaining an example of the method for compression of time-series data according to the first embodiment.
Figure 12:
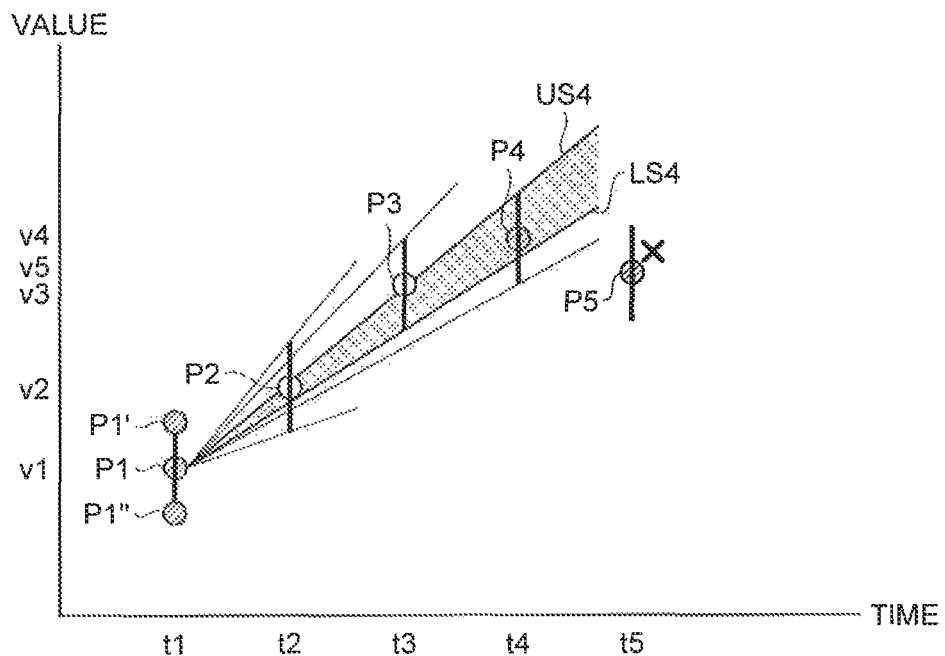
FIG. 12 is a diagram for explaining an example of the method for compression of time-series data according to the first embodiment.
Figure 13:
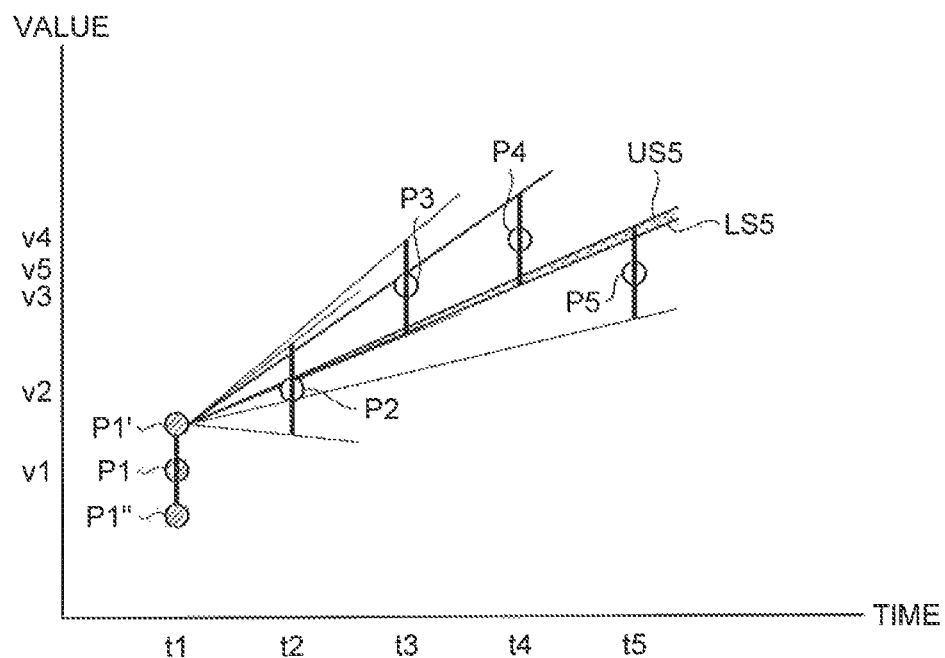
FIG. 13 is a diagram for explaining an example of the method for compression of time-series data according to the first embodiment.

Explained below with reference to FIG. 11 to FIG. 13 is an example of a case in which thinning calculation according to the second method for compression is performed. As illustrated in FIG. 11, P1<t1, v1>, P1'<t1, v1+α>, and P1"<t1, v1−α> serve as the starting point candidates. In FIG. 11 is illustrated an example in which thinning is performed with P1"<t1, v1−α> serving as the starting point from among the starting point candidates. As illustrated in FIG. 11, when P1"<t1, v1−α> is treated as the starting point, thinning can be performed up to P2, P3, and P4. However, it is not possible to perform thinning at P5.

In FIG. 12 is illustrated an example in which thinning is performed with P1<t1, v1> serving as the starting point. As illustrated in FIG. 12, when P1<t1, v1> is treated as the starting point, thinning can be performed on to P2, P3, and P4. However, it is not possible to perform thinning at P5.

In FIG. 13 is illustrated an example in which thinning is performed with P1'>t1, v1+α> serving as the starting point. As illustrated in FIG. 13, when. P1'<t1, v1+α> is treated as the starting point, thinning can be performed up to P2, P3, P4, and P5.

In this way, in the first and second methods for compression, only a single point serves as the starting point at t1. In contrast, in the first embodiment, a plurality of starting point candidates is set, and thinning calculation is performed in parallel while treating each starting point candidate as the starting point. For that reason, in the examples given above, when a single starting point is present, thinning is possible only up to P4 at a maximum. In contrast, in the method according to the first embodiment, thinning can be performed up to P5. In this way, in the method according to the first embodiment, at the same allowable error, a higher compression ratio is achieved.

Figure 14:
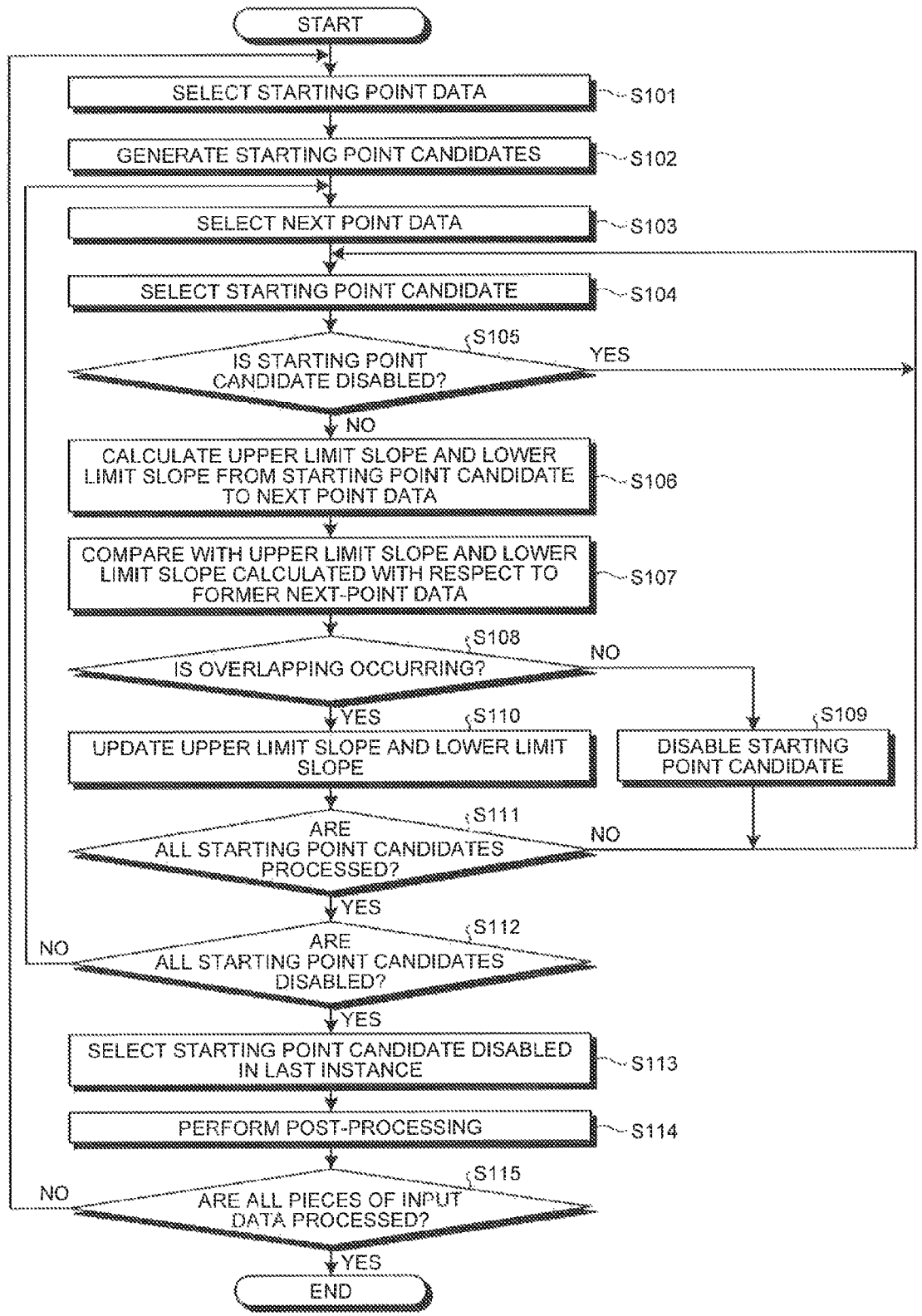
FIG. 14 is a flowchart for explaining an overall flow of a data compression operation according to the first embodiment.

Explained below with reference to FIG. 14 is a data compression operation performed in the data compression device 100 configured in the abovementioned manner according to the first embodiment. FIG. 14 is a flowchart for explaining an overall flow of the data compression operation according to the first embodiment. FIG. 14 represents an example of the case in which the second method for compression described above is implemented.

Firstly, the selecting unit 112 selects the starting point data (Step S101). For example, when pieces of time-series data are input in real time; the selecting unit 112 can select, as the starting point data, either the piece of point data that is input at the start or the piece of point data that is input after completion of a thinning operation with respect to already-input pieces of point data. Alternatively, when pieces of point data are sequentially input from already-stored time-series data; the selecting unit 112 can select, as the starting point data, either the piece of point data that is input at the start or the piece of point data that is input after completion of a thinning operation with respect to already-input pieces of point data.

Then, the generating unit 111 generates a plurality of starting point candidates that has an error within the allowable error with respect to the selected starting point data (Step S102).

Subsequently, the selecting unit 112 selects next point data (Step S103). Herein, the next point data indicates a piece of point data that, with the timing of input of the starting point data (the first timing) serving as the reference timing, is sequentially input at each successive timing (a second timing). The next point data is selected by sequentially shifting the timing until thinning cannot be performed any more. In the following explanation, the next point data selected at the previous timing is called former next-point data. Thus, the former next-point data at the timing at which thinning cannot be performed any more is equivalent to the end point data. The pieces of point data selected prior to the former next point data are equivalent to the intermediate data input in between the starting point data and the end point data (the former next-point data) present in the end.

As described above, the timing of input of the next point data can be a timing before or after the timing of input of the starting point data. Moreover, for example, when the pieces of point data are sequentially input, from the already-stored time-series data, there can be a situation in which the starting point data selected at Step S101 becomes the last piece of point data, and the next point data cannot be selected (obtained). In such a case, although not illustrated in FIG. 14, the registering unit 110 can end the data compression operation. Meanwhile, when the pieces of point data are input in real time the selecting unit 112 can hold back from performing the operation at Step S103 till the next piece of point data (the next point data) is obtained.

Subsequently, the selecting unit 112 selects a single starting point candidate from among the starting point candidates that are generated (Step S104). Then, the selecting unit 112 determines whether or not the selected starting point candidate has been disabled (Step S105). Herein, disabling means exempting from the subsequent operations such a starting point candidate at which thinning cannot be performed using the next point data that has been selected. For example, a starting point candidate at which thinning could not be performed during operations for the former next-point data is disabled while processing the former next-point data (Step S109 described later). In this way, at Step S105, it is determined whether the selected starting point candidate has been disabled during the operations performed till the previous step.

If the selected starting point candidate has been disabled (Yes at Step S105); then the selecting unit 112 returns to the operation at Step S104, selects the next starting point candidate, and repeats the operations. On the other hand, if the selected starting point candidate has not been disabled (No at Step S105), then the selecting unit 112 calculates the upper limit slope and the lower limit slope from the selected starting point candidate up to the next point data (Step S106). Then, the selecting unit 112 compares the calculated upper limit slope and the calculated lower limit slope with the upper limit slope and the lower limit slope calculated with respect to the former next-point data (Step S107). For example, the selecting unit 112 determines whether or not the allowable error range identified by the upper limit slope and the lower limit slope of the former next-point data overlaps with the allowable error range identified by the upper limit slope and the lower limit slope of the next point data.

Thus, the selecting unit 112 determines whether or not the two allowable error ranges overlap with each other (Step S108). If the two allowable error ranges do not overlap with each other (No at Step S108), the selecting unit 112 disables the currently-selected starting point candidate (Step S109). Then, the selecting unit 112 returns to the operation at Step S104. On the other hand, if the two allowable error ranges overlap with each other (Yes at Step S108), then the selecting unit 112 updates the upper limit slope and the lower limit slope tram the starting point candidate with the upper limit slope and the lower limit slope calculated with respect to the existing next point data (Step S110).

Subsequently, the selecting unit 112 determines whether or not all starting point candidates have been processed (Step S111). If all starting point candidates are yet to be processed (No at Step S111), the selecting unit 112 returns to the operation at Step S104 and repeats the operations. When all starting point candidates are processed (Yes at Step S111), the selecting unit 112 determines whether or not all starting point candidates have been disabled (Step S112). If all starting point candidates are yet to be disabled (No at Step S112), then the selecting unit 112 selects the point data at the next successive timing as the new next point data, and repeats the operations (Step S103).

When all starting point candidates are disabled (Yes at Step S112), the selecting unit 112 selects the starting point candidate that is disabled in the last instance (Step S113). As a result of such operations, the selecting unit 112 becomes able to select the starting point candidate at which a greater number of pieces of point data (intermediate data) are approximated to have the error within the allowable error.

Meanwhile, if there is a plurality of starting point candidates that is disabled in the last instance, the selecting unit 112 selects one of those starting point candidates. Herein, from among a plurality of starting point candidates that is disabled in the last instance, the selecting unit 112 selects the starting point candidate having a closer value to the starting point data.

Depending on the selected starting point candidate, the compressing unit 113 performs post-processing for the purpose of correcting the value of the end point data (the former next-point data) (Step S114). Alternatively, the configuration can be such that the end point data is output without performing post-processing.

Figure 15:
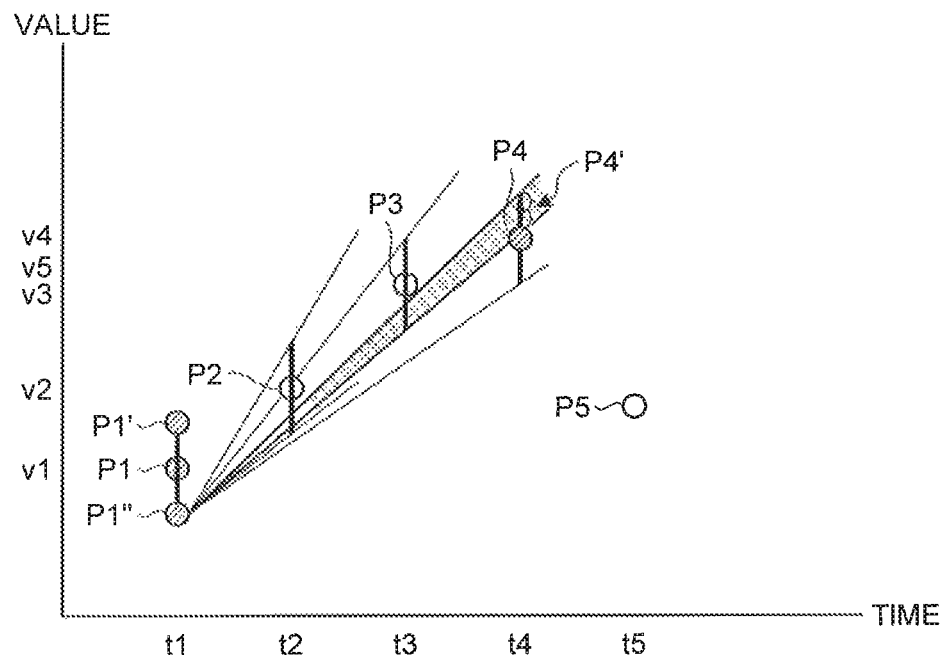
FIG. 15 is a diagram for explaining an example of post-processing.

FIG. 15 is a diagram for explaining an example of post-processing. In FIG. 15 is illustrated an example in which thinning cannot be performed when P5 serves as the next point data, and P4 remains as the former next-point data (the end point data). Herein, it is assumed that P1" is selected as the starting point candidate. The compressing unit 113 obtains the average slope of the upper limit slope and the lower limit, slope of the former next-point data. Then, the compressing unit 113 treats the straight line having the tilt equal to the abovementioned average slope as the approximated data string, and obtains the value of the data string at t4. Subsequently, the compressing unit 113 sets the value as the value (P4') of the corrected end point data. Then, the compressing unit 113 stores the selected starting point candidate and the corrected end point data in the memory unit 121.

Returning to the explanation with reference to FIG. 14, the selecting unit 112 determines whether or not all input data has been processed (Step S115). If all input data is yet to be processed (No at Step S115), then the selecting unit 112 selects the next piece of point data as the new starting point data (Step S101) and repeats the subsequent operations. For example, the next point data present at the time when all starting point candidates are disabled is selected as the new starting point data.

In this way, in the data compression according to the first embodiment, a plurality of starting point candidates is set, and thinning calculation is performed while treating each starting point candidate as the starting point. Then, a starting point candidate is selected at which a greater volume of data can be subjected to thinning, and the data subjected to thinning using the selected starting point candidate is output as the resultant data of compression. As a result, it becomes possible to enhance the compression ratio of the time-series data.

Second Embodiment

As a result of implementing the method according to the first embodiment, although an enhancement in the compression ratio is achieved, there also occurs an increase in the amount of calculation because of the thinning calculation performed in parallel among a plurality of starting point candidates. In that regard, in a data compression device according to a second embodiment, an operation (filtering) for skipping the thinning calculation is also performed.

Figure 16:
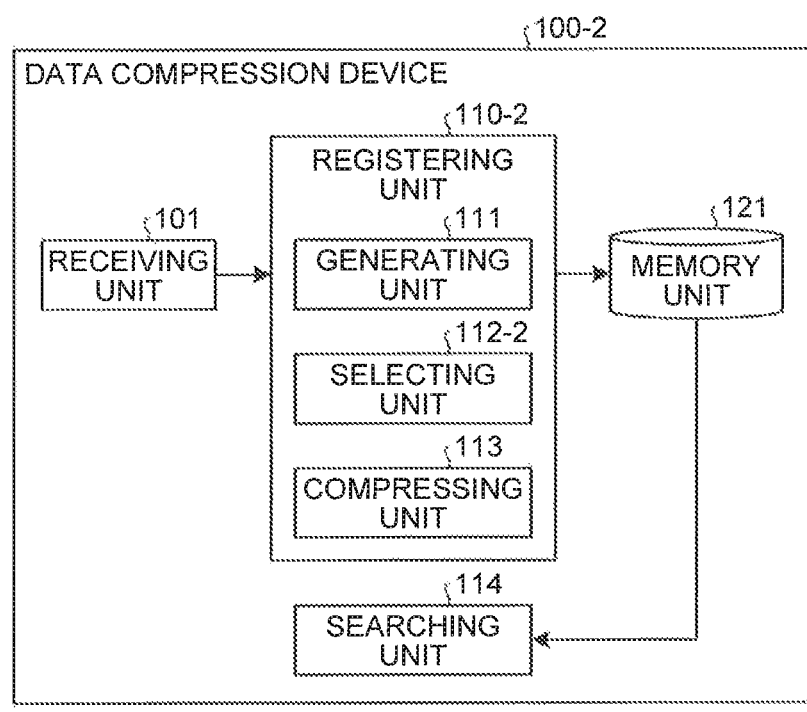
FIG. 16 is a block diagram illustrating an exemplary configuration of a data compression device according to a second embodiment.

FIG. 16 is a block diagram illustrating en exemplary configuration of a data compression device 100-2 according to the second embodiment. As illustrated in FIG. 16, the data compression device 100-2 includes the receiving unit 101, a registering unit 110-2, the searching unit 114, and the memory unit 121.

In the second embodiment, a selecting unit 112-2 of the registering unit 110-2 has different functions than the first embodiment. Apart from that, the configuration and the functions are identical to FIG. 1 that is the block diagram illustrating a configuration of the data compression device 100 according to the first embodiment. Hence, the configuration and the functions are referred to by the same reference numerals, and the explanation thereof is not repeated.

The selecting unit 112-2 not only has the functions of the selecting unit 112 but also has an additional function of filtering. The selecting unit 112-2 determines, prior to performing operations with respect to each starting point candidate, whether a range that is approximated to be within the allowable error in the former next-point data and a range that is approximated to be within the allowable error in the next point dare satisfy a predetermined condition. If the condition is satisfied, then the selecting unit 112-2 determines that approximation cannot be done to be within the allowable error in the next point data, and does not perform a determination operation with respect to the starting point candidates.

For example, the selecting unit 112-2 compares the minimum lower limit slope and the maximum upper limit slope of the former next-point data with the minimum lower limit slope and the maximum upper limit, slope of the (existing) next point data, and determines whether a predetermined condition is satisfied. Then, the selecting unit 112-2 obtains a determination value (such as true or false) indicating whether or not the condition is satisfied, and skips operations with respect to the starting point candidates according to the determination value.

Figure 17:
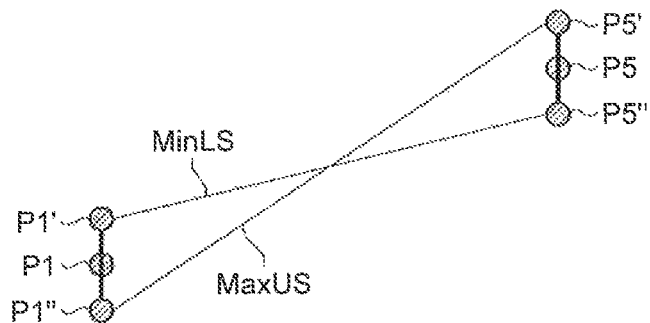
FIG. 17 is a diagram for explaining an example of a minimum lower limit slope and a maximum upper limit slope.

The minimum lower limit slope represents the minimum value from among the slopes (slopes) between the starting point candidates and a value obtained by subtracting the allowable error from the point data. The maximum upper limit slope represents the maximum value from among the slopes (slopes) between the starting point candidates and a value obtained by adding the allowable error to the point data. FIG. 17 is a diagram for explaining an example of a minimum lower limit slope MinLS and a maximum upper limit slope MaxUS.

With respect to P5, there are three upper limit slopes (referred to as US5, US5', and US5") having the starting points P1, P1', and P1", respectively. The maximum upper limit slope MaxUS indicates the maximum value from among the three upper limit slopes.

MaxUS=Max(US5,US5',US5")

In an identical manner, with respect to P5, there are three lower limit slopes (referred to as LS5, LS5', and LS5") having the starting points P1, P1', and P1", respectively. The minimum upper limit slope MinLS indicates the minimum value from among the three upper limit slopes.

MinLS=Min(LS5,LS5',LS5")

Figure 18:
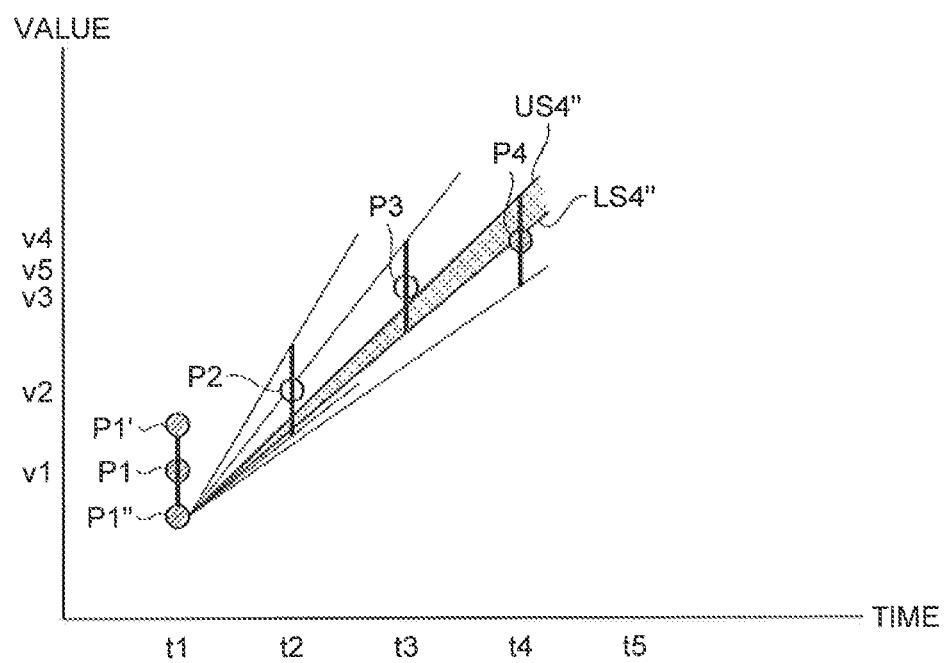
FIG. 18 is a diagram illustrating an example of an upper limit slope and a lower limit slope.
Figure 19:
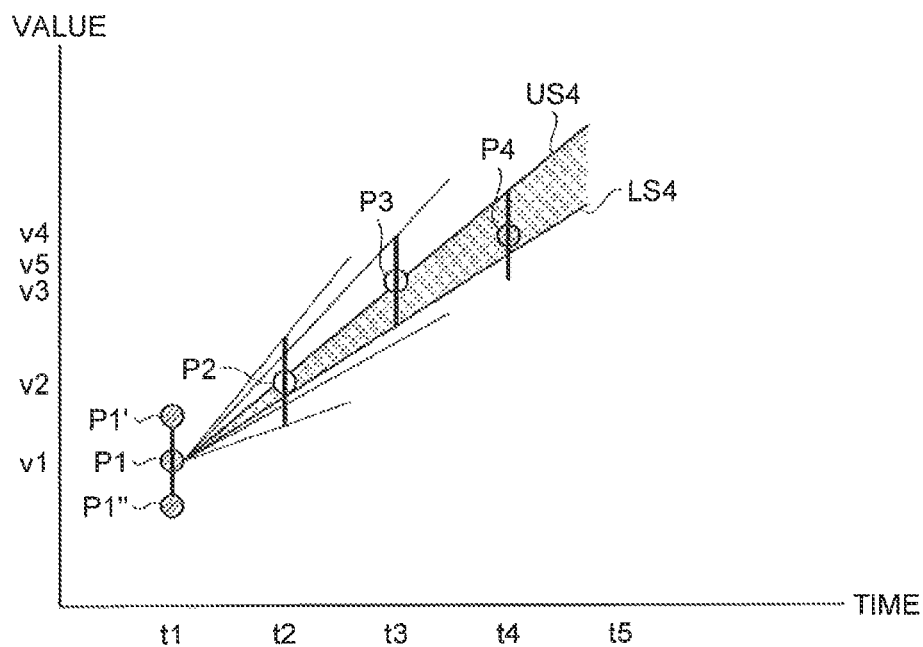
FIG. 19 is a diagram illustrating an example of the upper limit slope and the lower limit slope.
Figure 20:
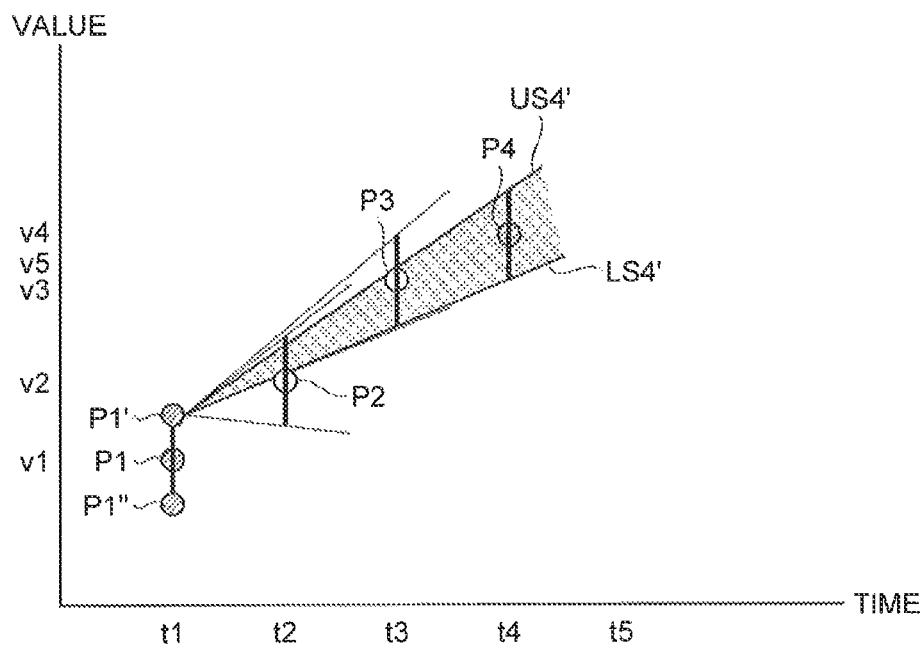
FIG. 20 is a diagram illustrating an example of the upper limit slope and the lower limit slope.

FIG. 18 to FIG. 20 are diagrams illustrating examples of the upper limit slope and the lower limit slope with respect to P4. In FIG. 18 is illustrated an upper limit slope US4" and a lower limit slope LS4" in the case when P1" serves as the starting point. In FIG. 19 is illustrated the upper limit slope US4 and the lower limit slope LS4 in the case when P1 serves as the starting point. In FIG. 20 is illustrated the upper limit slope US4' and the lower limit slope LS4' in the case when P1' serves as the starting point.

With respect to P4 too, the maximum upper limit slope and the minimum lower limit slope can be obtained in the following manner.

MaxUS=(US4,US4',US4")

MinLS=(LS4,LS4',LS4")

Herein, regarding P4 (the former next-point data), it is assumed that MinLS4 represents the minimum lower limit slope and MaxUS4 represents the maximum upper limit slope. Moreover, regarding P5 (the former next-point data), it is assumed that MinLS5 represents the minimum lower limit slope and MaxUS5 represents the maximum upper limit slope. The selecting unit 112-2 compares MinLS4, MaxUS4, MinLS5, and MaxUS5 according to the following condition, and calculates a determination value that indicates whether or not the condition is satisfied.

"MaxUS4<MinLS5" V "MinLS4>MaxUS5"

This condition indicates that "either the maximum upper limit slope at P4 is smaller than the minimum lower limit slope at P5 or the minimum lower limit slope at P4 is greater than the maximum upper slope at P5". In such a case, it is clear that the allowable error range with respect to P4 does not overlap with the allowable error range with respect to P5. For that reason, it becomes possible to skip the operation of calculating the slope for each starting point candidate, and to continue with the operations assuming that all starting point candidates have been disabled. That is, it becomes possible to reduce the amount of calculation by means of avoiding unnecessary calculation.

Figure 21:
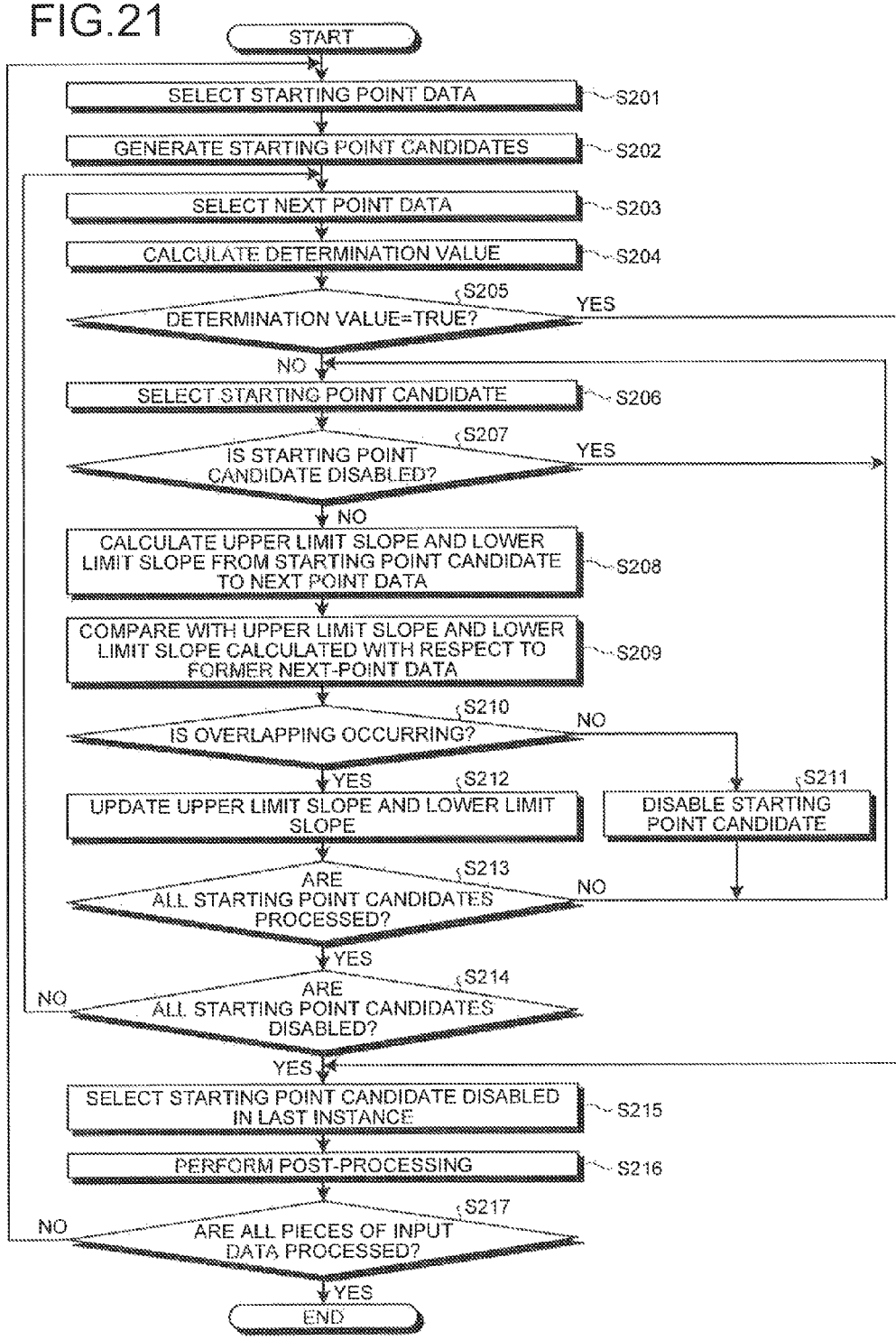
FIG. 21 is a flowchart for explaining an overall flow of a data compression operation according to the second embodiment.

Explained below with reference to FIG. 21 is a data compression operation performed in the data compression device 100-2 configured in the abovementioned manner according to the second embodiment. FIG. 21 is a flowchart for explaining an overall flow of the data compression operation according to the second embodiment.

The operations performed from Step S201 to Step S203 are identical to the operations performed from Step S101 to Step S103 in the data compression device 100 according to the first embodiment. Hence, that explanation is not repeated.

In the second embodiment, the selecting unit 112-2 calculates the determination value mentioned above (Step S204). Then, the selecting unit 112-2 determines whether or not the determination value is true (Step S205). If the determination value is false (No at Step S205), then the selecting unit 112-2 performs operations with respect to each starting point candidate (Step S206 to Step S214). Herein, the operations performed from Step S206 to Step S214 are identical to the operations performed from Step S104 to Step S112 according to the first embodiment. Hence, that explanation is repeated.

On the other hand, if the determination value is true (Yes at Step S205), then the selecting unit 112-2 proceeds to the operation at Step S215 without performing the operations from Step S206 to Step S214. The operations performed from Step S213 to Step S217 are identical to the operations performed from Step S113 to Step S115 according to the first embodiment. Hence, that explanation is not repeated.

In this way, in the data compression device according to the second embodiment, filtering is additionally performed with the aim of skipping the thinning calculation. As a result, it becomes possible to hold down the increase in the amount of calculation attributed to the use of a plurality or starting points.

Figure 22:
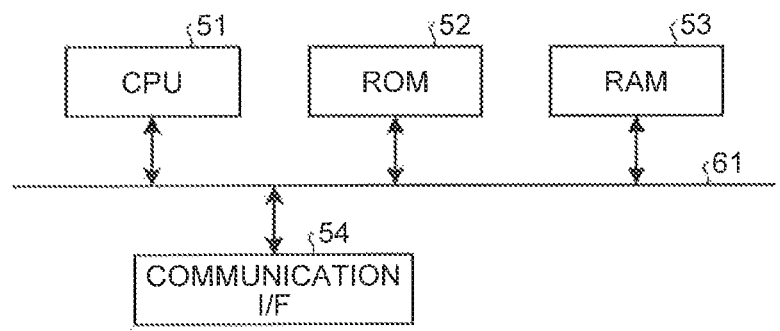
FIG. 22 is an explanatory diagram illustrating a hardware configuration of the data compression device according to the first embodiment or the second embodiment.

Explained below with reference to FIG. 22 is a hardware configuration of the data compression device according to the first embodiment or the second embodiment. FIG. 22 is an explanatory diagram illustrating a hardware configuration of the data compression device according to the first embodiment or the second embodiment.

The data compression device according to the first embodiment or the second embodiment includes a control device such as a CPU (Central Processing Unit) 51; memory devices such as a ROM (Read Only Memory) 52 and a RAM (Random Access Memory) 53; a communication I/F 54 that performs communication by establishing connection with a network; and a bus 61 that interconnects the other constituent elements.

Meanwhile, a data compression program executed in the data compression device according to the first embodiment or the second embodiment is stored in advance in the ROM 52 or the like.

Alternatively, the data compression program executed in the data compression device according to the first embodiment or the second embodiment can be recorded in the form of an installable or an executable file in a computer-readable recording medium such as a CD-ROM (Compact Disk Read Only Memory), a flexible disk (FD), to CD-R (Compact Read Recordable), or a DVD (Digital Versatile Disk).

Still alternatively, the data compression program executed in the data compression device according to the first embodiment or the second embodiment can be saved as a downloadable file on a computer connected to the Internet or can be made available for distribution through a network such as the internet.

The data compression program executed in the data compression device according to the first embodiment or the second embodiment can cause a computer to function as each constituent element of the data compression device described above. In that computer, the CPU 51 can read the data compression program from a computer-readable recording medium in a main memory device and then execute the data compression program.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data compression device comprising:
   a receiving unit configured to receive a plurality of pieces of input data which is input in chronological order;
   a generating unit configured to generate a plurality of starting point candidates which represents data having an error within a threshold value with respect to starting point data, the starting point data being the input data input at a first timing;
   a selecting unit configured to refer to the point candidates, end point data which is the input data input at a second timing, and intermediate data which is the input data input at a timing in between the first timing and the second timing, and to select, from among the starting point candidates, the starting point candidate which, as compared to other or the starting point candidates, has a greater number of pieces of the intermediate data approximated using the starting point candidate and using the end point data in such a way that an error is within the threshold value; and
   a compressing unit configured to output the selected starting point candidate and the end point data as output data obtained by compressing the starting point data, the intermediate data, and the end point data.

2. The device according to claim 1, wherein, for each of the starting point candidates, the selecting unit repeatedly performs, by changing the second timing, a determination operation for determining whether or not the intermediate data is included in a range approximated using the starting point candidate and using the end point data in such a way that an error is within the threshold value, and selects the starting point candidate which, as compared to other of the starting point candidates, has a greater number of pieces of the intermediate data at the time when the intermediate data is last determined to be within approximated range.

3. The device according to claim 2, wherein, when the second timing is changed, the selecting unit determines whether or not a range approximated to have an error within the threshold value at a pre-change timing and a range approximated to have an error within the threshold value at a post-change timing satisfy a predetermined condition, and, when the predetermined condition is satisfied, determines that, at a post-change timing, the intermediate data is not included in a range approximated to be within the threshold value.

4. The device according to claim 3, wherein, at a pre-change timing as well as at a post-change timing, the selecting unit calculates a minimum lower limit slope which is a minimum value from among tilts of line segments from the starting point candidates to data having an error within the threshold value, calculates a maximum upper limit slope, which is a maximum value from among the tilts of the line segments, and determines whether or not the minimum lower limit slope and the maximum upper limit slope at a pre-change timing as well as the minimum lower limit slope and the maximum upper limit slope at a post-change timing satisfy the condition.

5. The device according to claim 1, wherein, when a plurality of the starting point candidate has the same number of pieces of the intermediate data, the selecting unit selects, from among a plurality of the starting point candidates having the same number of pieces of the intermediate data, the starting point candidate having a smaller difference with the starting point data.

6. The device according to claim 1, wherein, as the output data, the compressing unit outputs the selected starting point candidate and the end point data corrected according to the selected starting point candidate.

7. The device according to claim 1, wherein, from among the starting point candidates, the selecting unit selects the starting point candidate which, as compared to other of the starting point candidates, has a greater number of pieces of the intermediate data included in an allowable error range decided using the starting point candidate end using data having an error within the threshold value with respect to the end point data.

8. A data compression method employed in a data compression device including a receiving unit, a generating unit, a selecting unit and a compression unit, the data compression method comprising:
   receiving, by the receiving unit, a plurality of pieces of input data which is input in chronological order;
   generating, by the generating unit, a plurality of starting point candidates which represents data having an error within a threshold value with respect to starting point data, the starting point data being the input data input at a first timing;
   referring, by the selecting unit, to the starting point candidates, and point data which is the input data input at a second timing, intermediate data which is the input data input at a timing in between the first timing and the second timing, and selecting, by the selecting unit, from among the starting point candidates, the starting point candidate which, as compared to other of the starting point candidates, has a greater number of pieces of the intermediate data approximated using the starting point candidate and using the end point data in such a way that an error is within the threshold value; and
   outputting, by the compression unit, the selected starting point candidate and the end point data as output data obtained by compressing the starting point data, the intermediate data, and the end point data.

9. A data compression method, employed in a data compression device including a first setting unit, a generating unit, a second setting, a calculating unit, an updating unit, a disabling unit and a compression unit, for compressing time-series data that represents a series of point data containing timings and values obtained by measuring temporal changes of a phenomenon, the data compression method comprising:

setting, by the first setting unit, point data at a first timing as a starting point;

generating, by the generating unit, plurality of starting point candidates having an error within a threshold value with respect to the starting point;

setting, by the second setting unit, point data obtained at a timing later than the first timing as a point of interest;

calculating, by the calculating unit, for each of the starting point candidates, an upper limit slope and a lower limit slope based on a range of error with respect to the point of interest;

updating, by the updating unit, when an allowable error range specified by the calculated upper limit slope and the calculated lower limit slope overlaps with an allowable error range specified by an upper limit slope and a lower limit slope that are calculated with respect to a point of interest at previous timing, the upper limit slope and the lower limit slope and thinning the point of interest at the previous timing;

disabling, by the disabling unit, when an allowable error range specified by the calculated upper limit slope and the on lower limit slope does not overlap with an allowable error range specified by an upper limit slope and a lower limit slope that are calculated with respect to a point of interest at previous timing, the starting point candidate; and continuing, by the compression unit, when the starting point candidate that is not yet disabled is remaining, a thinning operation in which, with respect to the starting point candidate that is remaining, point data obtained at next timing is set as a point of interest.

10. A computer program product comprising a computer-readable medium containing a computer program that causes a computer to execute:

receiving a plurality of pieces of input data which is input in chronological order;

generating a plurality of starting point candidates which represents data having an error within a threshold value with respect to starting point data, the starting point data being the input data input at a first timing;

referring to the starting point candidates, end point data which is the input data input at a second timing, intermediate data which is the input data input at a timing in between the first timing and the second timing, and selecting, from among the starting point candidates, the starting point candidate which, as compared to other of the starting point candidates, has a greater number of pieces of the intermediate data approximated using the starting point candidate and the end point data in such a way that an error is within the threshold value; and outputting, to a memory unit, the selected starting point candidate and the end point data as output data obtained by compressing the starting point data, the intermediate data, and the end point data.

\* \* \* \* \*